(12) United States Patent
Cheng

(10) Patent No.: US 7,435,914 B2
(45) Date of Patent: Oct. 14, 2008

(54) TAPE SUBSTRATE, TAPE PACKAGE AND FLAT PANEL DISPLAY USING SAME

(75) Inventor: Ye Cheng Cheng, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 258 days.

(21) Appl. No.: 11/336,785

(22) Filed: Jan. 23, 2006

(65) Prior Publication Data
US 2007/0034402 A1    Feb. 15, 2007

(30) Foreign Application Priority Data
Aug. 12, 2005    (KR) .................. 10-2005-0074257

(51) Int. Cl.
*H05K 1/00*    (2006.01)
(52) U.S. Cl. .............. 174/268; 361/749; 361/784; 174/254; 174/255; 174/260; 174/262; 174/117 F
(58) Field of Classification Search .............. 361/749, 361/784; 174/260, 254, 268, 255, 262, 117 F
See application file for complete search history.

(56) References Cited
U.S. PATENT DOCUMENTS
5,568,363 A * 10/1996 Kitahara .............. 361/773
5,686,757 A * 11/1997 Urushima .............. 257/668
6,372,996 B2 * 4/2002 Lin et al. .............. 174/250
6,555,755 B1 * 4/2003 Yanagisawa .............. 174/254
2005/0078459 A1 * 4/2005 Yeon .............. 361/749

FOREIGN PATENT DOCUMENTS

| JP | 06-112278 | 4/1994 |
|---|---|---|
| JP | 11-271793 | 10/1999 |
| KR | 1020000034177 | 6/2000 |
| KR | 1020010076329 A | 8/2001 |
| KR | 1020030013737 A | 2/2003 |
| KR | 1020030045224 A | 6/2003 |
| KR | 1020050011205 A | 1/2005 |

* cited by examiner

Primary Examiner—Dean A. Reichard
Assistant Examiner—Hoa C Nguyen
(74) Attorney, Agent, or Firm—Volentine & Whitt, PLLC

(57) ABSTRACT

A tape substrate having hole(s) formed discontinuously along a bent portion thereof and configured to dissipate stress applied to the bent portion. A tape package using the tape substrate may be connected to a panel and a printed circuit board using an ACF. The tape package may be bent and located behind at least one side of the panel.

14 Claims, 8 Drawing Sheets

TAPE SUBSTRATE, TAPE PACKAGE AND FLAT PANEL DISPLAY USING SAME

BACKGROUND OF THE INVENTION

1. Field of the Invention

Embodiments of the invention relate to a tape substrate and a semiconductor device using the tape substrate.

This application claims priority to Korean Patent Application No. 2005-74257 filed on Aug. 12, 2005, the subject matter of which is hereby incorporated by reference.

2. Description of the Related Art

Recent developments in the flat panel display industry, such as those related to liquid crystal displays (LCDs) and plasma display panels (PDPs) as well as related developments in thin film transistor (TFT) technologies, have resulted in dramatic changes to the nature and composition of tape packages generally used in a flat panel displays.

Conventional tape packages come in many different shapes and sizes and are implemented using a range of technologies. The tape carrier package (TCP) is one common type of tape package, and comprises a semiconductor package formed on a tape substrate having a window formed therein and a semiconductor chip mounted on the tape substrate using one of several available inner lead bonding techniques. Chip on film (COF) is another common type of tape package. The COF package generally comprises a tape substrate without a window and a semiconductor chip mounted on the tape substrate using, for example, a flip chip bonding technique.

The tape package generally comprises input/output wiring patterns formed on the tape substrate. These wiring patterns are used as external connection terminals. In some applications, the input/output wiring patterns may be attached directly to a printed circuit board or a display panel.

Figure (FIG.) 1 is a plan view of a conventional tape package 50. FIG. 2 is a related cross-sectional view of a flat panel display 100 incorporating tape package 50 of FIG. 1.

As shown in FIG. 1, exemplary tape package 50 is a COF package and comprises a tape substrate 10, a semiconductor chip 20 having multiple electrode bumps 22, and an encapsulant 30. Semiconductor chip 20 may be flip-chip bonded to tape substrate 10 using electrode bumps 22. Encapsulant 30 is typically used to protect a flip-chip bonded portion between tape substrate 10 and semiconductor chip 20.

Tape substrate 10 may include a base film 12 having an upper surface 11. Wiring patterns 15 are provided on upper surface 11. Upper surface 11 may further provide a chip mounting area on which semiconductor chip 20 is mounted. Sprocket holes 13 are arranged along the opposite edges of base film 12. Wiring patterns 15 are variously connected to electrode bumps 22 of semiconductor chip 20. Wiring patterns 15 generally include input wiring patterns 16 and output wiring patterns 17. Input wiring patterns 16 extend from one side of base film 12 to the chip mounting area, and output wiring patterns 17 extend from the opposite side of base film 12 to the chip mounting area. Input wiring patterns 16 and output wiring patterns 17 may extend in parallel rows from sprocket holes 13. A protective layer 18 may be provided on wiring patterns 15, exposing respective ends of input wiring patterns 16 and output wiring patterns 17.

As shown in FIG. 2, flat panel display 100 may include tape package 50, a panel 60 having a chamfered edge 66, and a printed circuit board 70. An anisotropic conductive film (ACF) 80 may connect tape package 50 to panel 60 and printed circuit board 70. For example, one end of output wiring pattern 17 may be connected to electrode bump 22 of semiconductor chip 20, and the other end of output wiring pattern 17 may be connected to the edge of panel 60. One end of input wiring pattern 16 may be connected to electrode bump 22 of semiconductor chip 20 and the other end of input wiring pattern 16 may be connected to the edge of printed circuit board 70. Flexible tape package 50 may be bent so that printed circuit board 70 may be located behind panel 60.

Accordingly, tape package 50 may have a bent portion 40. The portion of output wiring patterns 17 at bent portion 40 may be bent and input wiring patterns 16 may be located behind panel 60. The bent portion 40 of tape package 50 may be positioned quite closely around chamfered edge 66 of panel 60.

However, if tape substrate 10 is bent excessively, it may break at the bent portion 40 corresponding to the chamfered edge 66 of panel 60. Thereby output wiring patterns 17 may be damaged.

That is, output wiring patterns 17 may include a portion 17a exposed through protective layer 18 and ACF 80. The exposed portion 17a may thus be impacted by mechanical stresses generated during a bending process, thereby resulting in damage to output wiring patterns 17.

Unfortunately, during the manufacture of flat panel display 100, mechanical stresses are generated by the handling of panel 60. For example, during the assembly of panel 60 within its constituent chassis, mechanical stress is routinely applied to bent portion 40. These mechanical stresses may cause the exposed portion 17a of output wiring patterns 17 to crack, which may result in short circuits during a reliability testing, or worse still during customer use.

SUMMARY OF THE INVENTION

Embodiments of the present invention effectively dissipate the mechanical stresses applied to the bent portion of a tape substrate during manufacture, and thereby reduce the likelihood that output wiring patterns may become damaged.

Thus, in one embodiment the invention provides a tape substrate comprising; a base film comprising a chip mounting area and a bent portion, wiring patterns provided on the base film, the wiring patterns comprising input wiring patterns extending from one side of the base film to the chip mounting area, and output wiring patterns extending from an opposite side of the base film to the chip mounting area, a protective layer provided on the wiring patterns and exposing respective ends of the input wiring patterns and of the output wiring patterns, and a hole formed in the bent portion of the base film and configured to dissipate mechanical stress applied to the bent portion.

In another embodiment, the invention provides a tape package comprising; a semiconductor chip having an active surface comprising electrode bumps, a tape substrate mounting the semiconductor chip via the electrode bumps, and an encapsulant sealing a bonded portion between the semiconductor chip and the tape substrate, wherein the tape substrate comprises; a base film comprising a chip mounting area and a bent portion, wiring patterns provided on the base film, the wiring patterns comprising input wiring patterns extending from one side of the base film to the chip mounting area, and output wiring patterns extending from an opposite side of the base film to the chip mounting area, a protective layer provided on the wiring patterns and exposing respective ends of the input wiring patterns and of the output wiring patterns, and a hole formed in the bent portion of the base film and configured to dissipate mechanical stress applied to the bent portion.

In yet another embodiment, the invention provides a flat panel display comprising a panel, a printed circuit board arranged such that it is provided behind one side of the panel, and a plurality of tape packages, each package adapted to connect the panel and the printed circuit board and comprising; a base film having a bent portion, and a hole formed in the bent portion and configured to dissipate mechanical stress applied to the bent portion.

BRIEF DESCRIPTION OF THE DRAWINGS

Several embodiments of the invention will be readily described with reference to the accompanying drawings in which like reference numerals designate like or similar elements. In the drawings.

DESCRIPTION OF EXEMPLARY EMBODIMENTS

Exemplary embodiments of the invention will now be described in some additional detail with reference to the accompanying drawings. The invention may, however, be embodied in many different forms and should not be construed as being limited to only the example embodiments set forth herein. Rather, the disclosed embodiments are provided as teaching examples. The principles and features of the invention may be employed in varied and numerous embodiments without departing from the scope of the invention.

It should be noted that the accompanying drawings are intended to illustrate the general characteristics of methods and devices associated with the exemplary embodiments. The drawings are not, however, to scale and may not precisely reflect the characteristics of a given embodiment, and should not be interpreted as defining or limiting the range of values or properties of example embodiments within the scope of this invention. Rather, for simplicity and clarity of illustration, the dimensions of some drawing elements have exaggerated.

Figure 1:
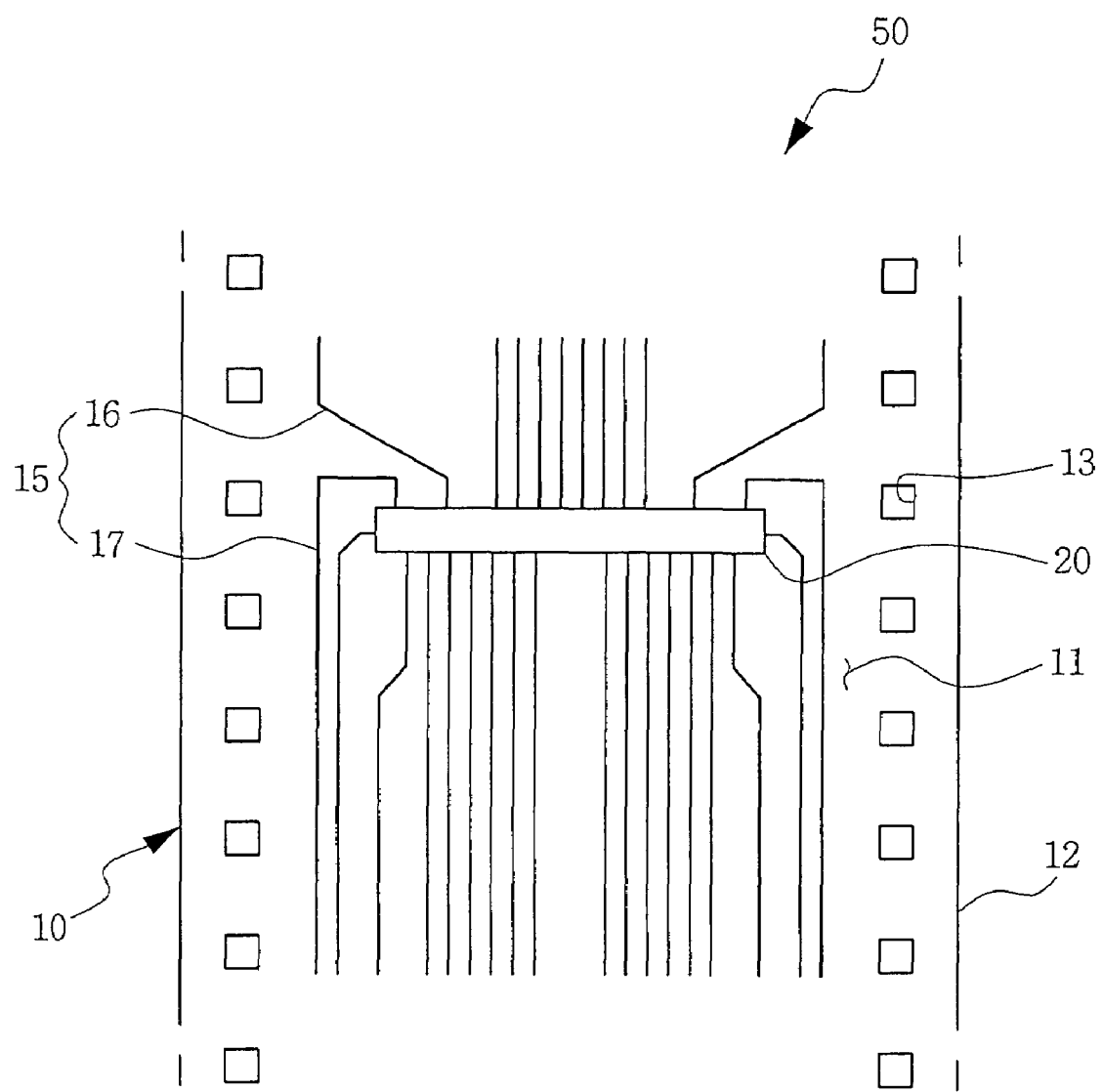
FIG. 1 is a plan view of a conventional tape package.
Figure 2:
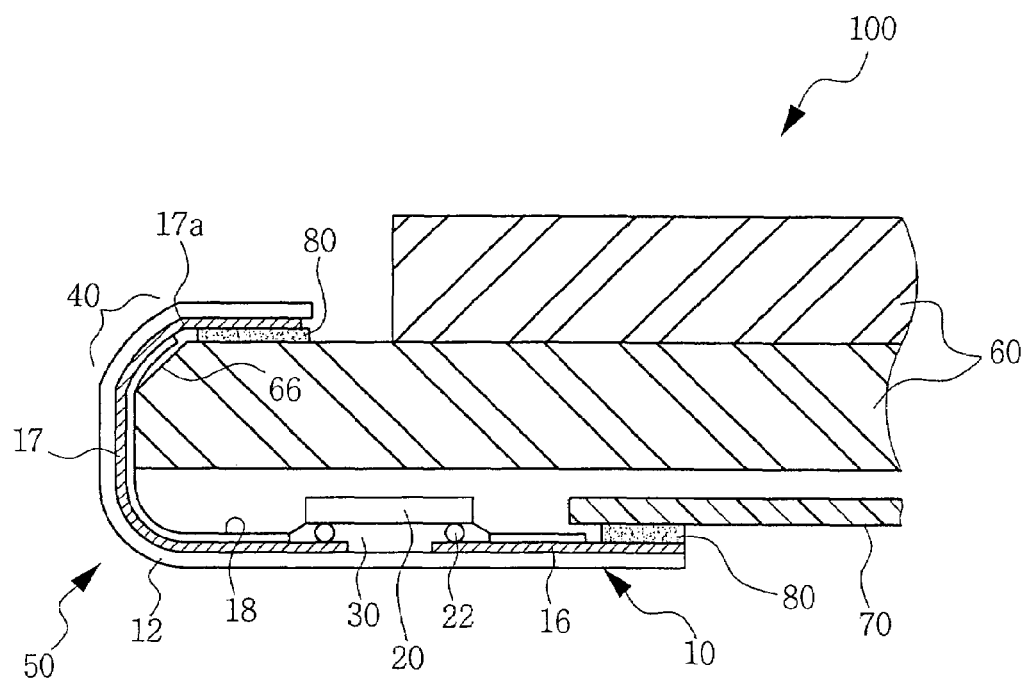
FIG. 2 is a cross-sectional view of a flat panel display using the tape package of FIG. 1.
Figure 3:
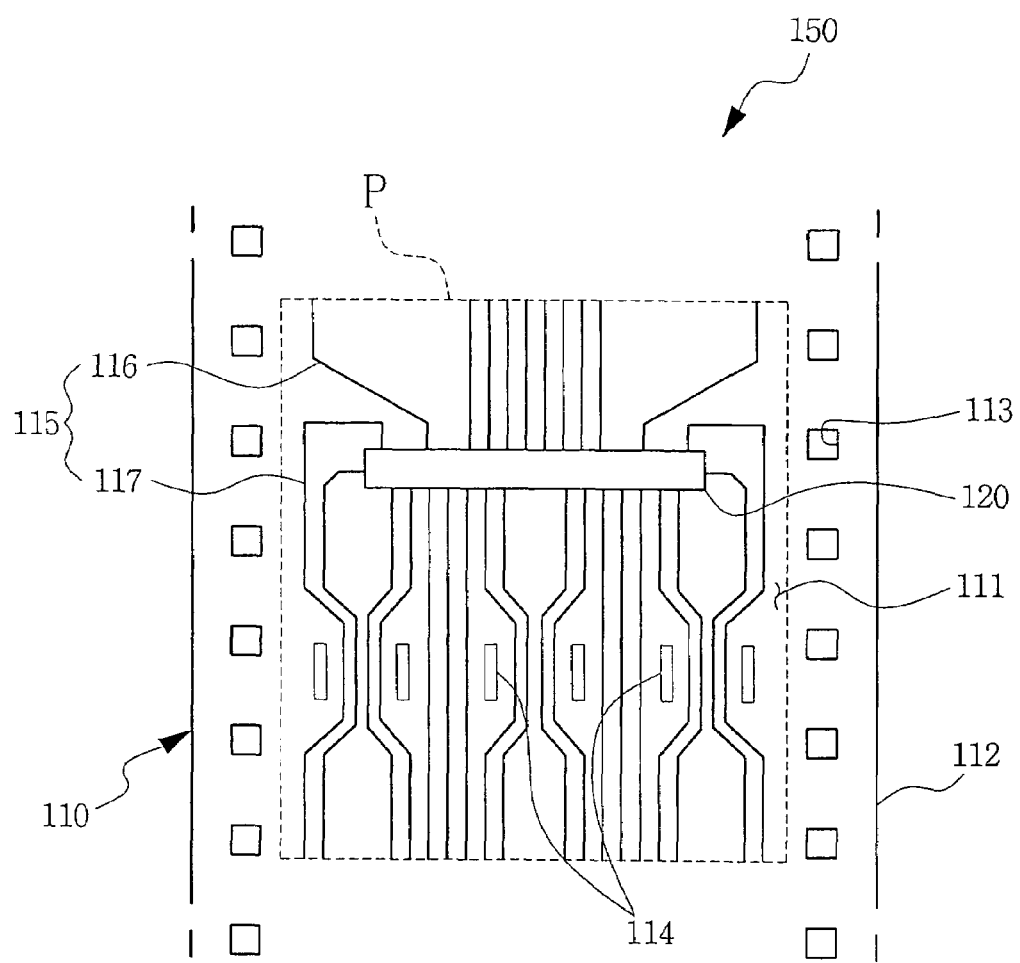
FIG. 3 is a plan view of a tape package in accordance with an example embodiment of the present invention.
Figure 4:
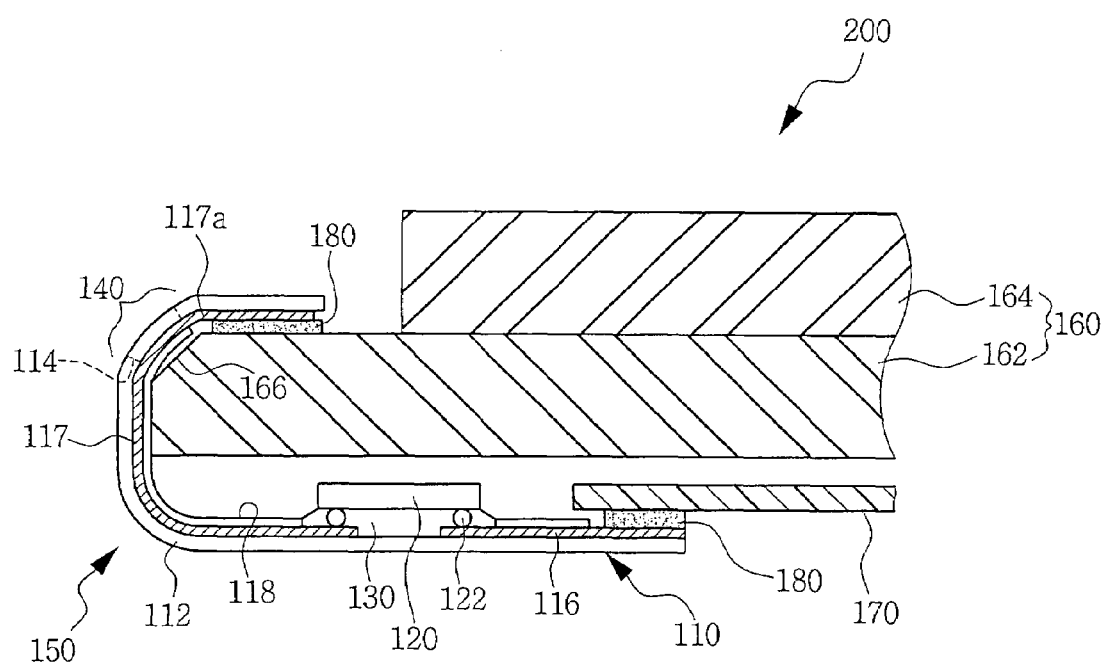
FIG. 4 is a cross-sectional view of a flat panel display using the tape package of FIG. 3.

FIG. 3 is a plan view of a tape package 150 designed and formed in accordance with one embodiment of the invention. FIG. 4 is a related cross-sectional view of a flat panel display 200 using the tape package 150 of FIG. 3.

Referring to FIGS. 3 and 4, tape package 150 comprises a semiconductor chip 120 having an active surface with electrode bumps 122, a tape substrate 110 having a bent portion 140, and an encapsulant 130 sealing a bonded portion between tape substrate 110 and semiconductor chip 120. Semiconductor chip 120 may be mounted on the tape substrate 110 using the electrode bumps 122. In one embodiment, a hole 114 is formed discontinuously in tape substrate 110, and more particularly in the bent portion 140 of tape substrate 110. Hole 114 is thus configured to dissipate stresses applied to the bent portion 140.

Specifically, electrode bumps 122 are arranged in the illustrated example along the edges of the active surface of semiconductor chip 120. Semiconductor chip 120 may, for example, be flip-chip bonded on tape substrate 110 using the electrode bumps 122. Encapsulant 130 may be formed, for example, using a conventional under-fill process to protect the flip-chip bonded portion between semiconductor chip 120 and tape substrate 110 from the external environment. The use of encapsulant 130 may also reduce the likelihood that faults forming as the result of different coefficients of thermal expansion for semiconductor chip 120 and tape substrate 120.

In one embodiment, tape substrate 110 comprises a base film 112 having an upper surface 111 and wiring patterns 115 provided on upper surface 111. Base film 112 may be formed from an insulating material, such as, for example, a polyimide. The wiring patterns 115 may be formed, for example, by patterning a copper (Cu) foil layer on base film 112.

Base film 112 generally comprises a chip mounting area on which semiconductor chip 120 may be center mounted. Sprocket holes 113 are arranged along the opposite edges of base film 112, and some automated boding processes are used to move tape package 150 through bonding and/or mounting areas. In such circumstances, the chip mounting area may be formed perpendicular to the rows of sprocket holes 113.

However, in other automated bonding processes, sprocket holes 113 are not needed and may be removed. In such circumstances, sprocket holes 113 area may be removed from the base film 112 and the resulting additional area, the so-called a package area (P), may be practically used as the base film 112.

In one embodiment, one end of wiring patterns 115 is formed in the peripheral region of the chip mounting area so as to be flip-chip bonded to electrode bumps 122 of semiconductor chip 120. In a related aspect, wiring patterns 115 may include input wiring patterns 116 and output wiring patterns 117. Input wiring patterns 116 may extend from one side of base film 112 to the chip mounting area, and output wiring patterns 117 may extend from the opposite side of base film 112 to the chip mounting area. In one embodiment, input wiring patterns 116 and the output wiring patterns 117 extend parallel to the rows of sprocket holes 113. In a related aspect of one embodiment, output wiring patterns 117 may be longer than input wiring patterns 116.

A protective layer 118 may be provided on wiring patterns 115 exposing the respective ends of input wiring patterns 16 and output wiring patterns 17. Protective layer 118 may be formed, for example, from solder resist.

Hole(s) 114 may be arranged along bent portion 140 to provide it with additional flexibility and resiliency to mechanical stress. The formation of hole(s) 114 will reduce the likelihood that bent portion 140 becomes broken due to excessive bending of base film 112 and thus protects output wiring patterns 117 from damage.

Output wiring patterns 117 may be formed (e.g., geometrically laid out) on base film 112 between adjacent hole(s) 114, as well as around a particular hole 114. Obviously, if the output wiring patterns 117 is exposed through a hole 114, the exposed output wiring patterns 117 will not be properly supported by base film 112. That is, cracks or short circuits may occur in the exposed output wiring patterns 117.

Bent portion 140 may be arranged near the end opposite to one end of the output wiring pattern 117 proximate the chip mounting area. Accordingly, hole(s) 114 may be arranged near the end opposite to one end of output wiring pattern 117 proximate the chip mounting area. Hole(s) 114 may be uniformly arranged across bent portion 140 to uniformly dissipate stresses applied to bent portion 140. The size and number of hole(s) 114 may be varied such that output wiring patterns 117 may be conveniently arranged on base film 112 without design intrusion by hole(s) 114. In one embodiment, however, hole(s) 114 are formed with a slot shape having a predetermined length parallel to the arrangement direction of output wiring patterns 117.

Flat panel display 200 adapted for use with tape package 150 is further described with reference to FIG. 4. Here, flat panel display 200 comprises a panel 160, a printed circuit board 170 and a plurality of parallel arranged tape packages 150 (one of which is viewable from the cross section provided by FIG. 4). Printed circuit board 170 may be arranged in disposition along one side of panel 160. Tape package 150 is connected between panel 160 and printed circuit board 170.

More specifically in relation to the illustrated example, respective anisotropic conductive films (ACFs) 180 is used to connect wiring patterns 115 of tape package 150 to panel 160 and printed circuit board 170. For example, output wiring patterns 117 may be connected to panel 160, and input wiring patterns 116 may be connected to printed circuit board 170 using an ACF 180. Flexible tape package 150 may then be bent, such that printed circuit board 170 is located "behind" (i.e., substantially in parallel along one side of) panel 160.

In one embodiment, panel 160 includes a lower panel 162 and an upper panel 164 provided on lower panel 162. The edges of lower panel 162 may be exposed from upper panel 164 to provide a connection area for tape package 150. Patterns may be formed on the exposed edges of lower panel 162 and be connected to output wiring patterns 117 of tape package 150. Lower panel 162 may have a chamfered edge 166 formed to curve the upper surface of the exposed edges.

Within the foregoing arrangement, since hole(s) 114 are arranged across bent portion 140 of tape package 150, the stress exerted on bent portion 140 is effectively dissipated, thereby reducing the likelihood that output wiring patterns 117 running through bent portion 140 may become damaged. In a related embodiment, output wiring patterns 117 may comprise a portion 117a exposed through (e.g., not covered by) protective layer 118. This exposed portion of output wiring patterns 117 is provided to correspond in position with the chamfered edge 166 of lower panel 162 proximate ACF 180. Hole(s) 114 may be provided in bent portion 140 to improve flexibility proximate exposed portion 117a.

In one embodiment of the invention, tape package 150 comprises a COF package. In an alternative embodiment, tape package 150 comprises a TCP.

In one embodiment, bent portion 140 may be provided in output wiring patterns 117, and hole(s) 114 may be provided in output wiring patterns 117. In an alternative embodiment, bent portion 140 may be provided in input wiring patterns 116, and hole(s) 114 may be provided in input wiring patterns 116.

Figure 5:
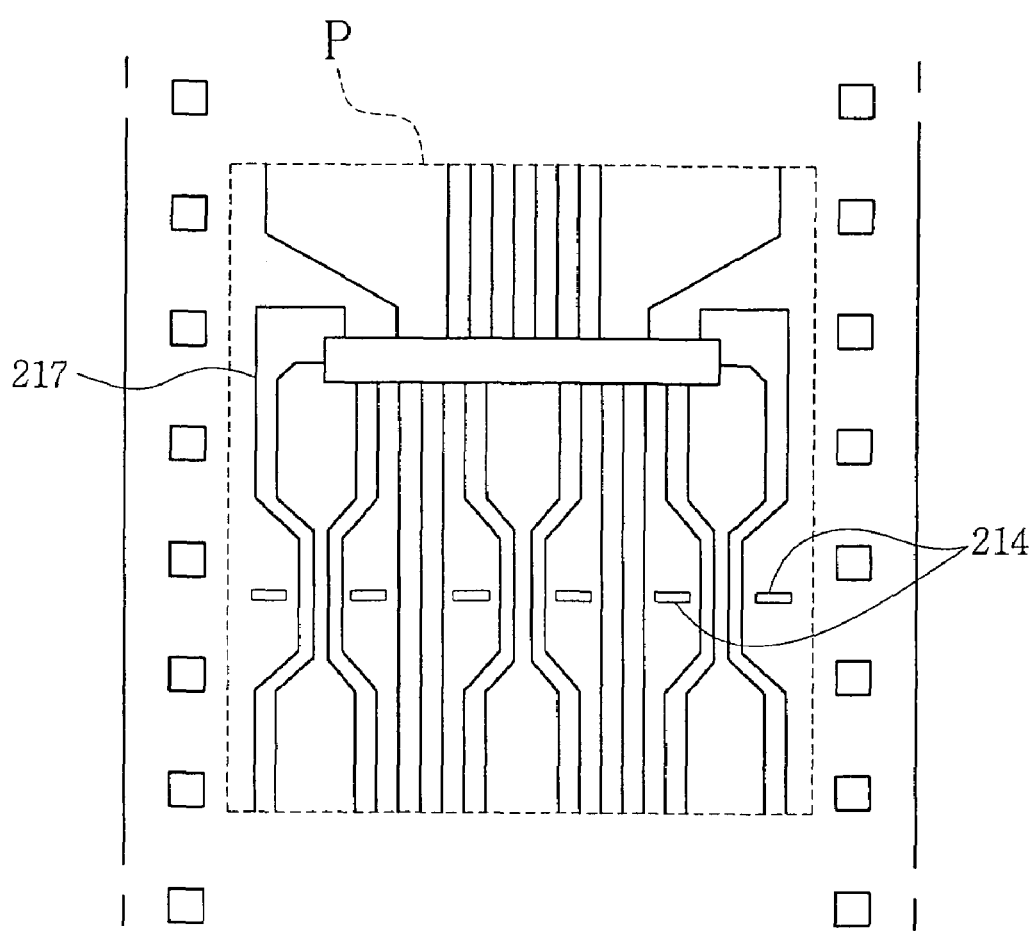
FIGS. 5 through 8 are plan views of tape packages in accordance with other example embodiments of the present invention.
Figure 6:
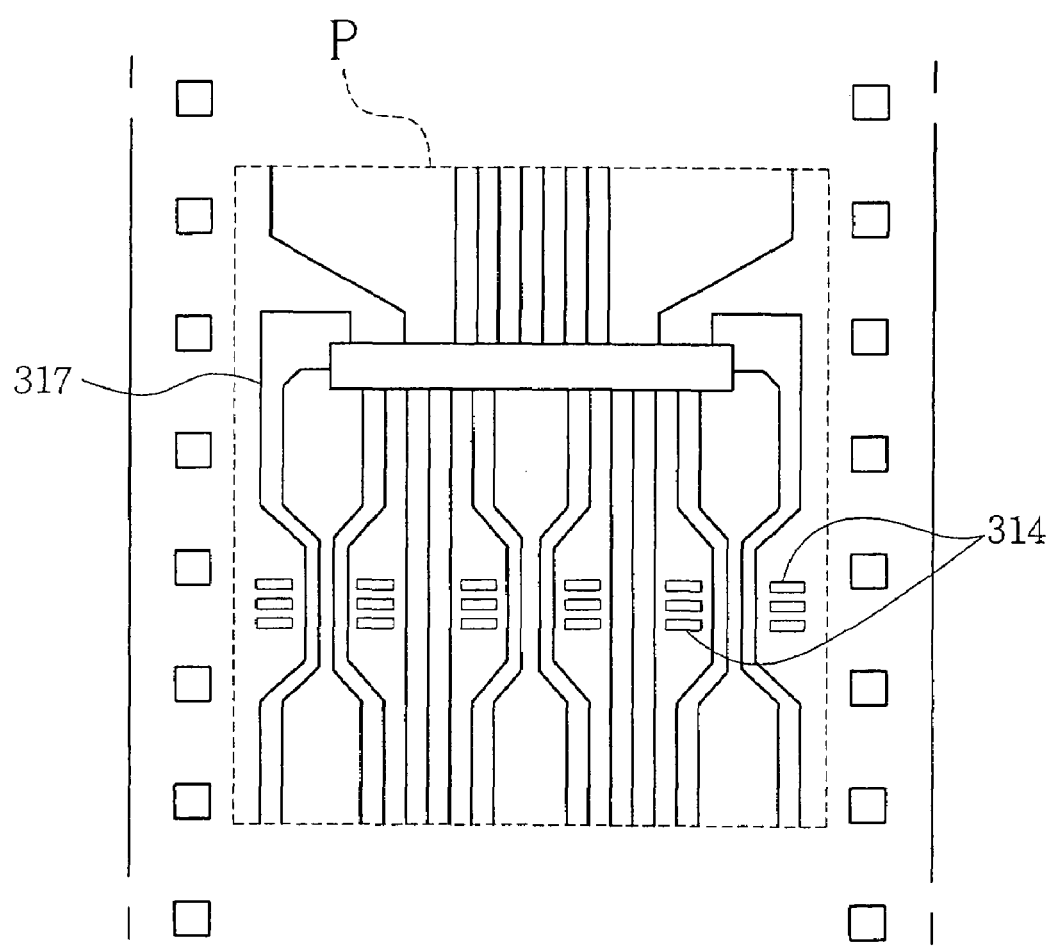
Figure 7:
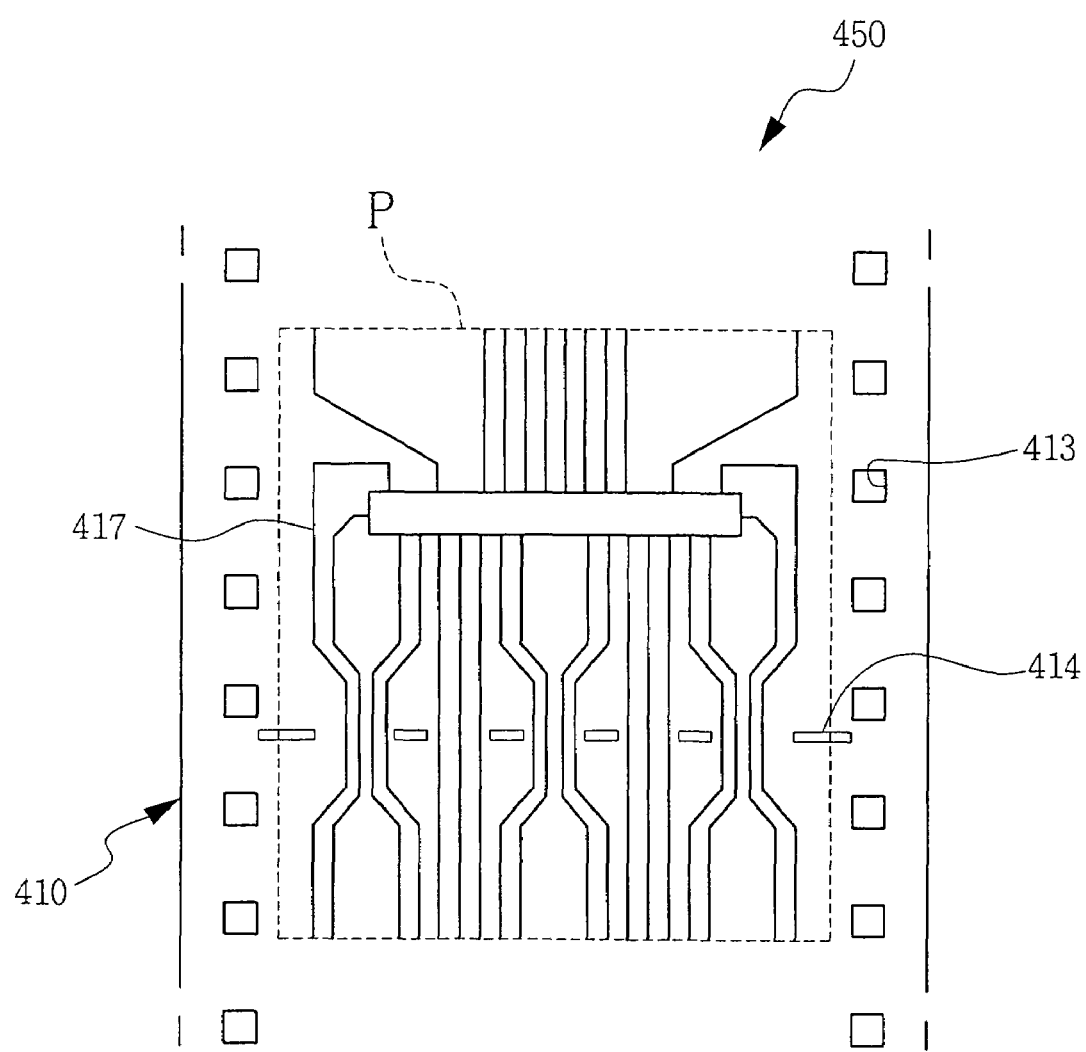
Figure 8:
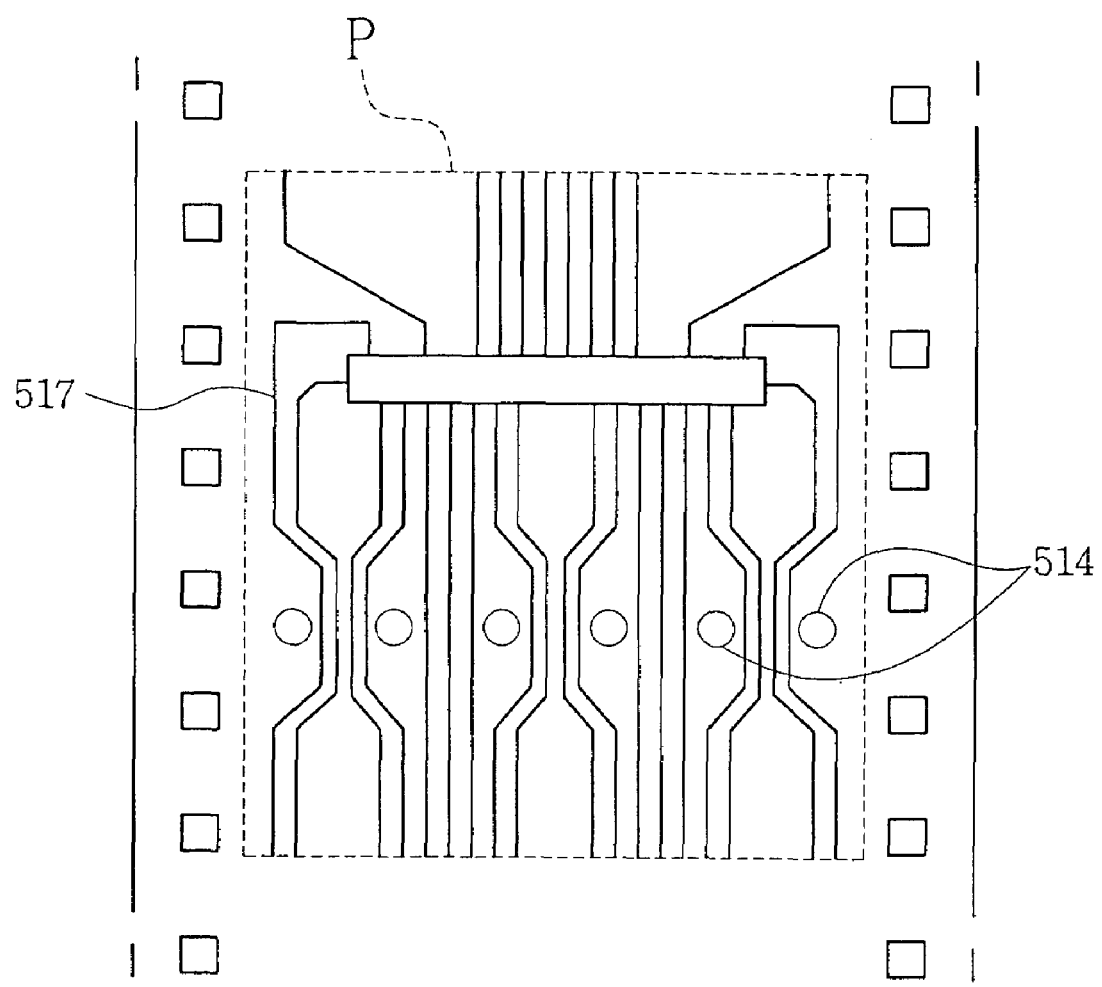

As an alternative to the slot shaped hole(s) 114 shown in the illustrated example of FIG. 3, wherein the lateral edge of the slot runs substantially in parallel with the output wiring patterns 117, holes 114 might be formed with a slot shape in which their lateral edge runs perpendicular to the arrangement direction of output wiring patterns 117. For example, as shown in FIG. 5, a series of holes 214 are arranged in package area (P) at regular intervals across an arrangement of output wiring patterns 217. As shown in FIG. 6, a series of hole sets 314 may be formed (e.g., with three (3) holes per set) in package area (P) at regular intervals across output wiring patterns 317. As shown in FIG. 7, a series of holes 414 may extend outside the package area (P) of the tape package 450. For example, the series of holes (414) may extend into the sprocket hole area. As shown in FIG. 8, a hole 514 may be formed having a circular shape. In alternative embodiments, hole(s) may be formed with various shapes.

Although the invention has been described in relation to exemplary embodiments, it should be understood that many variations and/or modifications to the illustrated inventive concepts may be made without departing from the scope of the invention as defined in the appended claims.

What is claimed is:

1. A tape substrate comprising:
   a base film comprising a package area, a sprocket hole area disposed outside of the package area and comprising a plurality of sprocket holes, and a bent portion, wherein a chip mounting area is disposed in the package area, and no portion of any of the sprocket holes is disposed in the package area;
   wiring patterns provided on the base film, the wiring patterns comprising input wiring patterns extending from one side of the base film to the chip mounting area, and output wiring patterns extending from an opposite side of the base film to the chip mounting area;
   a protective layer provided on the wiring patterns and exposing respective ends of the input wiring patterns and of the output wiring patterns; and
   a plurality of stress-relieving holes disposed in the bent portion of the base film and extending across the package area, wherein at least one of the of stress-relieving holes is partially disposed in the package area and partially disposed in the sprocket hole area.

2. The tape of claim 1, wherein each one of the plurality of stress-relieving holes is formed with an oval, a circle, or a slot shape.

3. The tape of claim 1, wherein the bent portion is located in a portion of the base film more distant from the chip mounting area than the other end of the base film.

4. The tape of claim 3, wherein each one of the plurality of stress-relievinq holes has a slot shape, wherein the longer side of the slot shape extends in a direction parallel to the arrangement direction of the wiring patterns.

5. The tape of claim 3, wherein each one of the plurality of stress-relieving holes has a slot shape, wherein the longer side of the slot shape extends in a direction perpendicular to the arrangement direction of the wiring patterns.

6. The tape of claim 5, wherein the plurality of stress-relieving holes extends across the entire width of the base film.

7. The package of claim 1, wherein the wiring patterns are disposed only within the package area.

8. A tape package comprising:
   a semiconductor chip having an active surface comprising electrode bumps;
   a tape substrate mounting the semiconductor chip via the electrode bumps; and
   an encapsulant sealing a bonded portion between the semiconductor chip and the tape substrate,
   wherein the tape substrate comprises:
      a base film comprising a package area, a sprocket hole area disposed outside of the package area and comprising a plurality of sprocket holes, and a bent portion, wherein a chip mounting area is disposed in the package area, and no portion of any of the sprocket holes is disposed in the package area;
      wiring patterns provided on the base film, the wiring patterns comprising input wiring patterns extending from one side of the base film to the chip mounting area, and output wiring patterns extending from an opposite side of the base film to the chip mounting area;
      a protective layer provided on the wiring patterns and exposing respective ends of the input wiring patterns and of the output wiring patterns; and
      a plurality of stress-relieving holes disposed in the bent portion of the base film and extending across the package area, wherein at least one of the stress-relieving holes is partially disposed in the package area and partially disposed in the sprocket area.

9. The package of claim 8, wherein each one of the plurality of stress-relieving holes is formed with an oval, a circle, or a slot shape.

10. The package of claim 8, wherein the bent portion is located in a portion of the base film more distant from the chip mounting area than the other end of the base film.

11. The package of claim 10, wherein each one of the plurality of stress-relieving holes has a slot shape, wherein the longer side of the slot shape extends in a direction parallel to the arrangement direction of the wiring patterns.

12. The package of claim 10, wherein each one of the plurality of stress-relieving holes has a slot shape, wherein the longer side of the slot shape extends in a direction perpendicular to the arrangement direction of the wiring patterns.

13. The package of claim 12, wherein the plurality of stress-relieving holes extends across the entire width of the base film.

14. The package of claim 8, wherein the wiring patterns are disposed only within the package area.

* * * * *